United States Patent [19]

Hamada et al.

[11] Patent Number: 4,783,817

[45] Date of Patent: Nov. 8, 1988

[54] ELECTRONIC NOISE ATTENUATION SYSTEM

[75] Inventors: Hareo Hamada, 4-8-1 Kajino-cho, Koganei, Tokyo; Takashi Enokida, Ichikawa; Tanetoshi Miura, 1-11-20 Minami-cho, Kokubunji, Tokyo; Minoru Takahashi; Takashi Kuribayashi; Kinichiro Asami; Yoshitaka Oguri, all of Chiyoda, Japan

[73] Assignees: Hitachi Plant Engineering & Construction Co., Ltd.; Tanetoshi Miura; Hareo Hamada, all of Tokyo, Japan

[21] Appl. No.: 2,242

[22] Filed: Jan. 12, 1987

[30] Foreign Application Priority Data

Jan. 14, 1986 [JP] Japan .................................. 61-7115

[51] Int. Cl.$^4$ .............................................. H03B 29/00

[52] U.S. Cl. .......................................... 381/71; 381/94

[58] Field of Search .................................... 381/71, 94

[56] References Cited

U.S. PATENT DOCUMENTS

| | | | |
|---|---|---|---|
| 4,480,333 | 10/1984 | Ross | 381/71 |
| 4,596,033 | 6/1986 | Swinbanks | 381/71 |
| 4,677,676 | 6/1987 | Eriksson | 381/71 |

*Primary Examiner*—Forester W. Isen

*Attorney, Agent, or Firm*—Parkhurst, Oliff & Berridge

[57] ABSTRACT

An electronic noise attenuation system for attenuation of non-steady noise occurring in a propagation passage such a duct line by conducting adaptive controls by use of a computer system including a digital filter therein. Sensing microphones $M_1$, $M_2$ are located in the propagation passage with a cancellation sound source S therebetween at positions where the transfer functions Hr, Ht of a sound wave generated from the cancellation sound source are equivalent to each other. The output signal of the sensing microphone $M_1$ and the phase-inverted version of the output signal of the sensing microphone $M_2$ are input via an add circuit to the control part of the system. The system can prevent the occurrence of an acoustic feedback from the cancellation sound source to the sensing microphone $M_1$ so as to realize a stable and highly accurate noise attenuation.

14 Claims, 6 Drawing Sheets

ELECTRONIC NOISE ATTENUATION SYSTEM

BACKGROUND OF THE INVENTION

1. Field of the Invention

The present invention relates to a system for attenuating noise electronically and, in particular, to an electronic noise attenuation system which is capable of attenuating non-steady noise occurring in propagation passages such as duct lines or the like by exercising an adaptive control using a computer system including a digital filter therein.

2. Description of the Prior Art

Conventionally, there has been widely put into practical use a passive noise attenuation apparatus which attenuates noise occurring within ducts by use of the interference due to the duct structure or the noise absorption due to a porous material attached to the duct. However, this type of noise attenuation apparatus is found disadvantageous in that it is too big in size, it involves too much loss of pressure, and so on.

On the other hand, there is also available an active noise attenuation apparatus which has been long proposed and employs another method of the reduction of unwanted sounds within the duct. That is, recently, special interest has been given to an electronic noise attenuation system of such active type in which noise propagated from a source of noise is sensed, a cancellation sound having the same sound pressure and an opposite phase with respect to the sensed noise is generated against the noise to provide sound wave interference between the noise and the cancellation sound, and thus the noise can be cancelled forcibly by the sound wave interference. With the rapid progress of an electronic device, signal processing technique and the like, there have been recently published various kinds of study results on such active electronic noise attenuation method and apparatus.

However, there are left many problems to be solved and thus such electronic noise attenuation method or apparatus has not yet come into a stage of seriously practical application.

A technical problem in putting into practice such electronic noise attenuation system consists in the construction of a model which can be used as a basis for design of a control system of the electronic noise attenuation system. The model must be able to cope with the following points. At first, there is necessary a filter which is capable of cancelling noise of continuous spectra. That is, if a cancellation sound can be generated with respect to the noise of continuous spectra such as automotive noise, air current noise and the like as well as the noise of discrete spectra such as transformer noise, compressor noise and the like, the applications of the electronic noise attenuation system can then be expanded further. To realize this, a filter is required which is able to provide arbitrary amplitude characteristics and phase characteristics.

Secondly, it is necessary to prevent the feedback of the cancellation sound with respect to a sensing microphone. That is, in the electronic noise attenuation system, there is interposed the sensing microphone between a source of noise and a source of cancellation sounds within a propagation passage through which sound waves are propagated, and it is necessary to create an electric signal to drive the cancellation sound source which generates sound waves to cancel the propagated sound waves from the noise source, in accordance with the sounds sensed by the sensing microphone and by some proper signal generation means. In this case, the sound waves generated from the cancellation sound source is also caught by the sensing microphone and, as a result of this, there is produced an acoustic feedback system between the cancellation sound source and the sensing microphone. For this reason, it is essential to take a countermeasure to cope with this situation. Especially, in order to make compact the electronic noise attenuation system and to allow it to be mounted at an arbitrary position in a pipe line such as a duct line, the sensing microphone and the cancellation sound source must be located adjacent to each other. Therefore, the above-mentioned acoustic feedback has a great influence on the electronic noise attenuation system and thus the counter-measure to cope with this problem is very important.

Thirdly, it is necessary to make it possible to correct the characteristics of electro-accoustic transducers such as a microphone, speaker and the like used in the electronic noise attenuation system. That is, in order to stabilize the the control function of the electronic noise attenuation system, it is essential that the control system of the electronic noise attenuation system is provided with a function to correct the minute amount of deterioration of the characteristics of the electro-acoustic transducers. This is another problem to be solved.

According to the conventional electronic noise attenuation systems of this kind, the above-mentioned technical problems have not been solved at all, making it impossible to put the conventional systems into practice.

In contrast with this, we have successfully come up with models on an electronic noise attenuation system using a monopole system as well as on an electronic noise attenuation system using a dipole system, both of which are able to cope with the above-mentioned technical problems as described in detail afterwards.

Out of our models, the model on the electronic noise attenuation system of the monopole type is able to perfectly deal with the above-mentioned first and third technical problems for realization of the electronic noise attenuation system. However, with regard to the second technical problem, that is, the prevention of the feedback of the cancellation sound with respect to the sensing microphone, since a control system for cancellation of such feedback becomes complicated in structure, the model cannot help employing passive means: for example, the consideration of the directivities of the respective electro-acoustic transducers such as the sensing microphone and the like as well as the positional relationships therebetween; and, the attachment of a sound absorption material to the inside of the propagation passage of sound waves extending from the cancellation sound source to the sensing microphone.

Also, the other model of our models mentioned above, namely, the electronic noise attenuation system of the dipole type according to the other model is able to cope with all of the above-mentioned three technical problems. However, it has been found too complicated in structure for practical application, although the control system thereof is simpler in structure when compared with that of the electronic noise attenuation system of the monopole type in realizing the prevention of the feedback of the cancellation sound with respect to the sensing microphone.

As described above, as the passive means to prevent the feedback of the cancellation sound, there are known several methods: in one of them, the directivities of mechano-electric transducing means such as a sensing microphone or electro-mechanical transducing means such as a speaker are improved for prevention of the cancellation sound feedback; and, in another method, the distance between the sensing microphone and the cancellation sound source is extended to reduce the energy of the cancellation sound.

However, in view of the fact that in the low frequency noises that produce a large amount of feedback the wavelengths are about several meters to several tens of meters, in order to provide the sensing microphone with an extreme directivity, the electronic noise attenuation system must be large in size whether it employs a waveguide or microphone arrays. This prevents the miniaturization of a noise attenuator which is one of the effects given by the electronic noise attenuation system, making the system impractical. This is a common problem in a method in which the distance between the sensing microphone and the cancellation sound source is extended to prevent the feedback of the cancellation sound.

Further, in order to give a directivity to a speaker which is a typical example of the electro-mechanical transducers, there has been proposed a method in which three speakers are used to produce a directional sound source which generates only progressive waves. However, it requires a complicated control circuit but the effect thereof on the prevention of the feedback is not so great for the complication of the control circuit, that is, this method is disadvantageous in being not practical.

As discussed above, it is not easy to prevent the feedback of the cancellation sound with respect to the sensing microphone. But, it is currently requested that this problem is solved by a practical means.

SUMMARY OF THE INVENTION

The present invention aims at eliminating the drawbacks found in the above-mentioned prior art methods of and apparatuses for the attenuation of noise.

Accordingly, it is an object of the invention to make clear a model which can be used as a basis for design of a control system of an electronic noise attenuation system capable of positively restricting by means of a simple structure the acoustic feedback of a cancellation sound from a electro-mechanical transducer, or a source of the cancellation sound to a mechano-electrical transducer for sensing a propagation wave from a source of noise, as well as to provide such electronic noise attenuation system that can accurately cancel non-steady noise occurring in a propagation passage such as a duct line and the like in accordance with the above-mentioned model.

In order to accomplish the above object, according to the invention, there is provided an electronic noise attenuation system for achieving attenuation of a propagation sound wave from a source of noise in a sound wave propagation passage by generating a cancellation sound wave 180° out of phase and of the same sound pressure with the propagation sound wave to produce a sound wave interference between them at a given position in the sound wave propagation passage, the electronic noise attenuation system comprising: a first mechano-electrical transducing means located closer to the noise source from the given position in the propagation passage to sense the propagation sound wave from the noise source and convert it into an electrical signal; an electro-mechanical transducing means interposed between the position of the first mechano-electrical transducing means and the given position in the propagation passage to generate a sound wave for cancelling the propagation sound wave from the noise source at the given position; a second mechano-electrical transducing means interposed between the position of the electro-mechanical transducing means and the given position or located at the given position to sense the propagation sound wave from the electro-mechanical transducing means and the noise source and convert it into an electric signal; an operation means for obtaining a difference between the output signals of the first and second mechano-electrical transducing means; a drive signal generating means for receiving the output signal of the operation means to generate a drive signal to be given to the electro-mechanical transducing means so that the amount of sound cancellation of the electronic noise attenuation system can be the greatest in accordance with a given transfer function; and, a control means for determining the transfer function to be given to the drive signal generating means, establishing in the drive signal generating means control parameters to specify the transfer function, and correcting the control parameters according to the changes of the propagation characteristics of the propagation passage and the characteristics of the control system of the electronic noise attenuation system.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DETAILED DESCRIPTION OF THE INVENTION

Detailed description will hereunder be given of the preferred embodiments of a system for attenuating noise according to the present invention with reference to the accompanying drawings.

Figure 7:
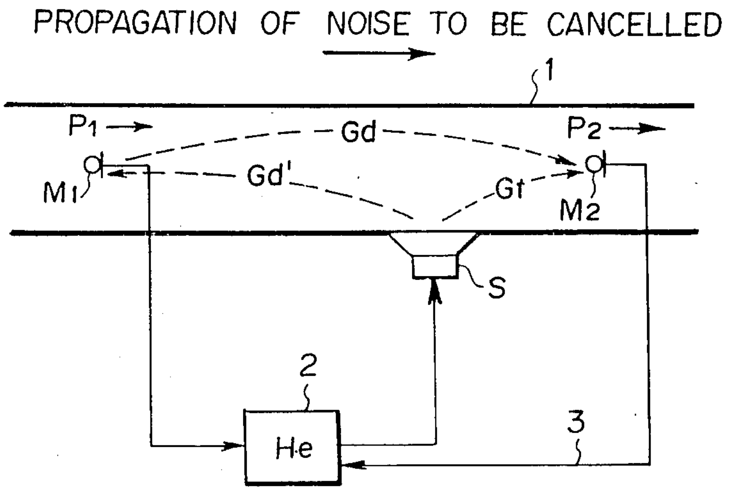
FIG. 7 is an explanatory view to show a model for an electronic noise attenuation system of a monopole sound source type.

Prior to explanation of concrete embodiments of the invention, the principles of an electronic noise attenuation system of a monopole sound source type employing a single source of a cancellation sound will be described in connection with FIG. 7. In FIG. 7, within a propagation passage 1 for sound waves there are provided a sensing microphone $M_1$ and a microphone $M_2$ which is located downstream of the position of the sensing microphone $M_1$ and is used to evaluate the noise attenuation effects. A source of a cancellation sound S is interposed between the two microphones $M_1$ and $M_2$. Also, between the sensing microphone $M_1$ and the cancellation sound source S there is arranged a controller 2.

In the above-mentioned structure, a propagation sound wave from a source of noise is first sensed and converted into an electric signal by the microphone $M_1$ and is then input to the controller 2.

Also, to the controller 2 is input an evaluation signal 3 for evaluation of the noise attenuation effects from the microphone $M_2$. Controller 2 outputs to the cancellation sound source S a drive signal allowing the output of the microphone $M_2$ to be zero at the position of the microphone $M_2$ due to interference produced between a cancelling sound wave generated from the cancellation sound source S and a sound wave propagated from the noise source. That is, such structure is able to cancel a sound wave generated from the noise source at the position where the microphone $M_2$ is located.

In order to enhance the noise cancellation effects in the thus constructed electronic noise attenuation system, it is necessary to examine a model in which transfer functions Gd, Gd', Gt representing the sound propagation characteristics between the respective electro-acoustical transducers shown in FIG. 7 as well as the conversion characteristics of the electro-acoustical transducers themselves such as the microphones $M_1$, $M_2$, cancellation sound source S and the like are taken into consideration. Also, it is necessary that the respective elements of the thus examined model are defined clearly.

Figure 8:
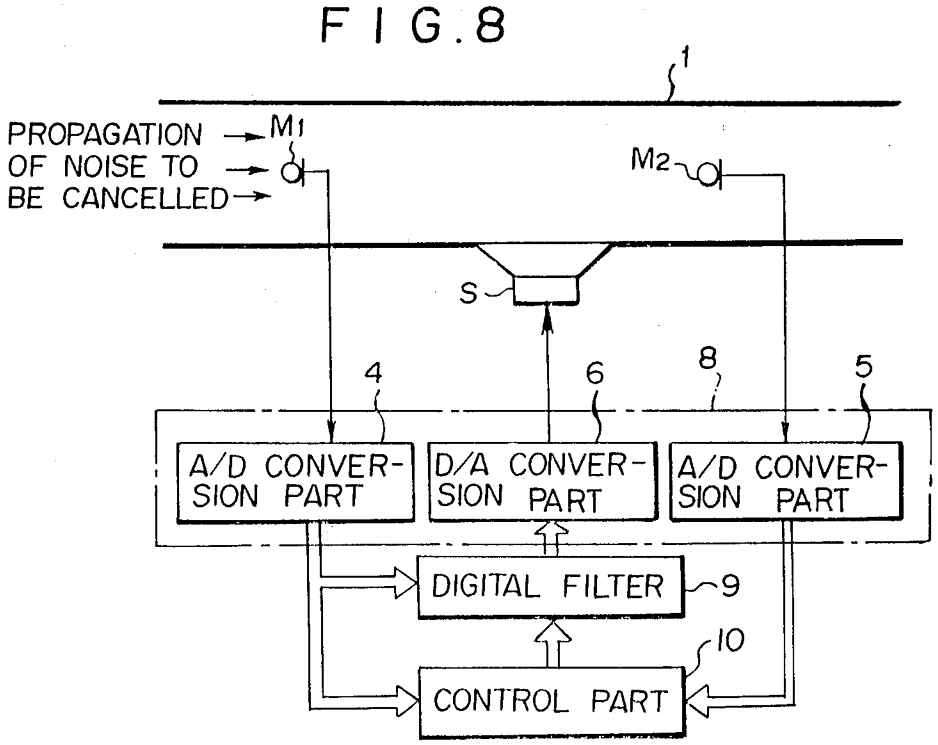
FIG. 8 is a block view to show the concrete structure of the electronic noise attenuation system of the monopole sound source type; and, FIG. 9 is a block view to show the structure of an electronic noise attenuation system of a dipole sound source type.
Figure 9:
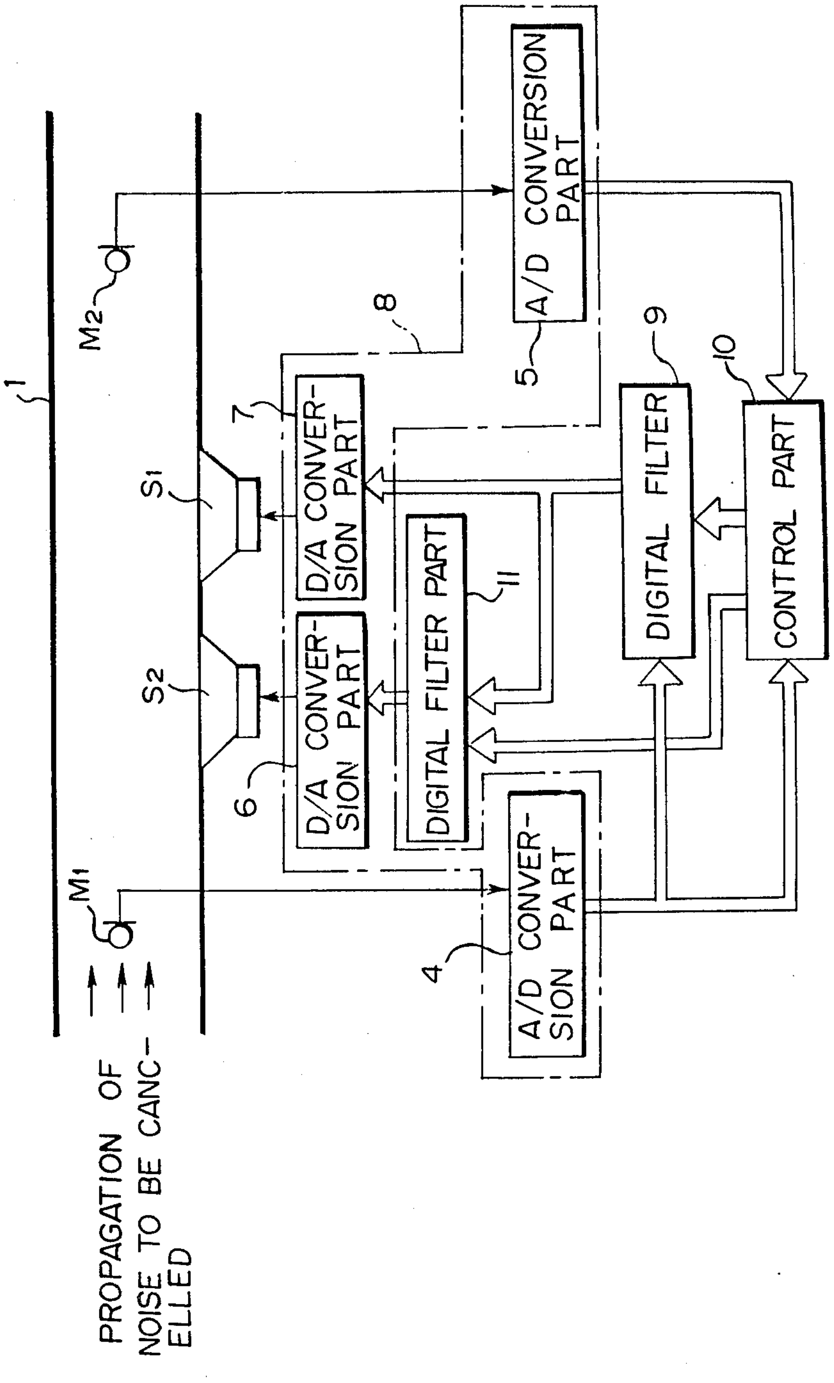

From these viewpoints, we have already developed models which are able to cope with the three problems discussed in the BACKGROUND OF THE INVENTION of this specification, and also which can respectively be used as basis for designing the respective control systems of an electronic noise attenuation system of a monopole sound source type (FIG. 8) and an electronic noise attenuation system of a dipole sound source type (FIG. 9), and concrete structures for realizing these models have also been made clear. These models and structures are disclosed in detail in Japanese patent application No. 139293 of 1985 and No. 128294 of 1985 and, therefore, the description thereof is omitted here.

Now, the present invention provides an electronic noise attenuation system of a dual sensing microphones system which is an improved version of a monopole sound source system and employs two sensing microphones, and the present electronic noise attenuation system is capable of easy restriction of the acoustical feedback from the cancellation sound source to the microphone $M_1$.

Figure 1:
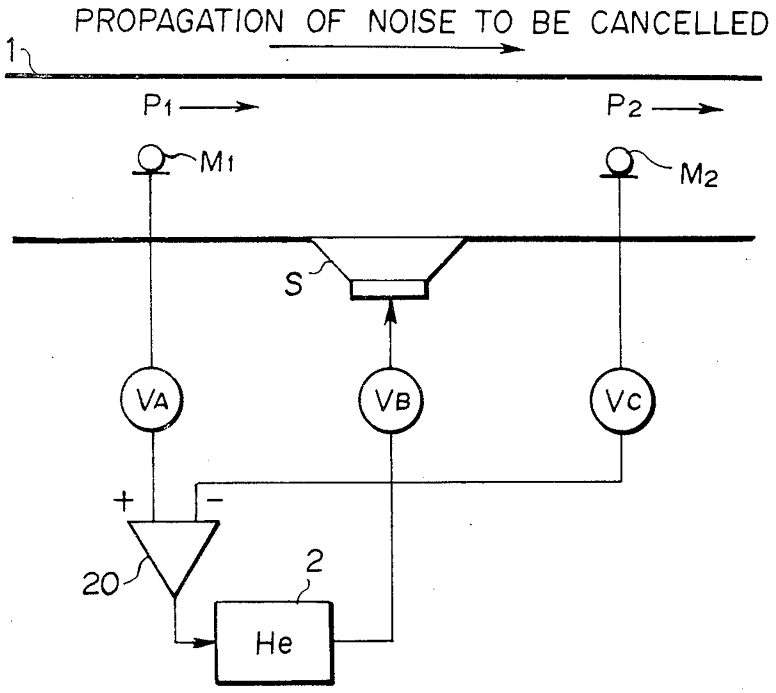
FIG. 1 is a schematic view to show the principles of an electronic noise attenuation system with dual sensing microphones in accordance with the present invention.

Referring now to FIG. 1, there is shown a view of the principles of an electronic noise attenuation system of a dual sensing microphones system according to the present invention.

The electronic noise attenuation system in FIG. 1 is different in structure from the electronic noise attenuation system of the monopole sound source system shown in FIG. 7 in that the two sensing microphones $M_1$, $M_2$ for sensing the propagated wave from the noise source are respectively located upstream and downstream of the cancellation sound source S in the sound wave propagation passage 1, and that the output of the sensing microphone $M_2$ is made 180° out of phase with the output of the sensing microphone $M_1$, the output signals thereof are input to an add circuit 20, and the output signal of the add circuit 20 is input to the controller 2.

Figure 2:
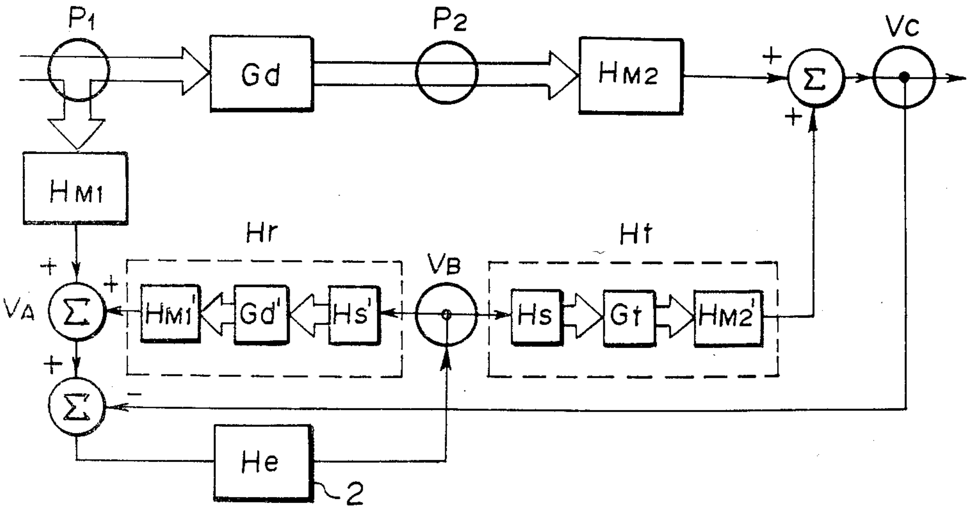
FIG. 2 is an explanatory view to illustrate a model of the electronic noise attenuation system shown in FIG. 1 in which the propagation characteristics of a propagation passage as well as the conversion characteristics of electro-acoustic transducers themselves are taken into consideration.

In FIG. 1, reference character He designates a transfer function which indicates the control characteristic of the controller 2. Also, the output terminal of the sensing microphone $M_1$, the input terminal of the cancellation sound source S and the output terminal of the sensing microphone $M_2$ are respectively given evaluation points $V_A$, $V_B$, $V_C$ which can be measured electrically. In FIG. 2, there is illustrated a model in which the propagation characteristics of the sound wave within the the propagation passage 1 as well as the conversion characteristics of the respective electro-acoustical transducers themselves are taken into consideration on the basis of these evaluation points $V_A$, $V_B$, $V_C$. In FIG. 2, wider arrow lines are used to show the directions of propagation of the sound wave, while solid arrow lines are used to show the flows of the electric signals.

Also, reference characters $P_1$, $P_2$ respectively stand for the sound pressures of the sound wave propagated from the noise source toward the downstream direction within the propagation passage 1 at the respective positions where the two microphones $M_1$, $M_2$ are located, and $V_A$, $V_B$, $V_C$, as described above, represent voltages measured at points set for the microphone $M_1$, a speaker S serving as the cancellation sound source, and the microphone $M_2$.

Further, Gd designates a transfer function which indicates the propagation characteristic of the sound wave propagated from the microphone $M_1$ to the microphone $M_2$, and $H_{M1}$, $H_{M2}$ respectively represent transfer functions to indicate the sound pressure—voltage conversion characteristics with respect to the sound wave sensed by the two microphones $M_1$, $M_2$ within the propagation passage 1.

Moreover, $H_{M1'}$ designates a transfer function to indicate the sound pressure—voltage conversion characteristic of the sensing microphone $M_1$ with respect to the sound wave propagated from the direction of the cancellation sound speaker S; $H_{M2'}$ a transfer function to indicate the sound pressure—voltage conversion characteristic of the sensing microphone $M_2$ with respect to the sound wave propagated from the direction of the cancellation sound speaker S; $H_S$ a transfer function to indicate the voltage—sound pressure conversion characteristic of the cancellation sound speaker S toward the direction of the sensing microphone $M_2$; and, Hs' a transfer function to indicate the voltage—sound pressure conversion characteristic of the cancellation sound speaker S toward the direction of the sensing microphone $M_1$.

In addition, Gd' designates a transfer function to indicate the propagation characteristic of the sound wave propagated from the cancellation sound speaker S to the sensing microphone $M_1$ within the propagation passage; and, Gt denotes a transfer function to indicate the propagation characteristic of the sound wave propagated from the cancellation sound speaker S to the sensing microphone $M_2$ within the propagation passage.

In the model shown in FIG. 2, when Hr is used to express a transfer function indicating the propagation characteristic of the sound wave propagated from the cancellation sound source S to the sensing microphone $M_1$ with the conversion characteristics of the cancellation sound source S and the sensing microphone $M_1$ added thereto, and Ht is used to express a transfer function indicating the propagation characteristic of the sound wave propagated from the cancellation sound source S to the sensing microphone $M_2$ with the conversion characteristics of the cancellation sound source S and the sensing microphone $M_2$ added thereto, then the respective transfer functions can be expressed as:

$$Hr=H_{M1}'\cdot Gd'\cdot Hs' \quad (1)$$

$$Ht=Hs\cdot Gt\cdot H_{M2}' \quad (2)$$

Figure 3:
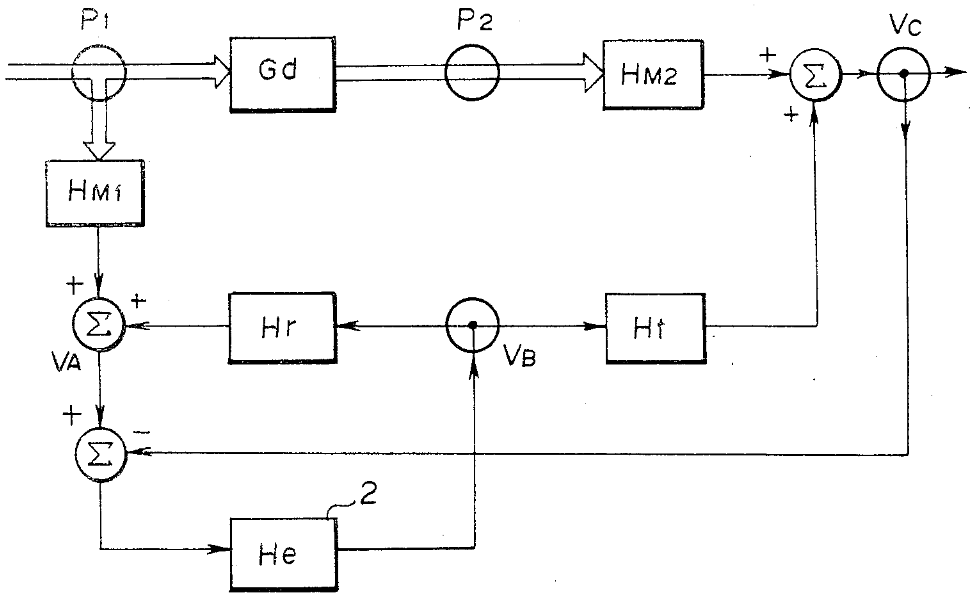
FIG. 3 is an explanatory view to illustrate a simplified version of the model shown in FIG. 2.

As shown above, if the model shown in FIG. 2 is replaced by the transfer functions Hr, Ht, then the model can be further simplified as shown in FIG. 3.

In the dual sensing microphones system proposed here, the two sensing microphones $M_1$, $M_2$ having the matched characteristics are respectively located at positions with respect to the cancellation sound source S where the two transfer functions Ht, Hr are equal to each other (briefly, two positions equidistant from the cancellation sound source S within the propagation passage 1); the output of the sensing microphone $M_2$, with the phase thereof being made 180° out of phase with that of the output of the microphone $M_1$, is input to the add circuit 20; and, the output of the add circuit 20 is input to the controller 2.

In this structure, the propagation sound wave generated from the cancellation sound source S and sensed by the sensing microphone $M_1$ can be cancelled electrically by the add circuit 20 and thus the oscilation of the control system can be suppressed.

As discussed above, the dual sensing microphones system is very advantageous in that it is able to prevent the acoustical feedback of the cancellation sound simply by adding to the monopole sound source system a sensing microphone and a basic add circuit as an electric circuit.

Next, a transfer function He is derived on the basis of FIG. 3 which indicates the control characteristic of the controller 2 that allows the cancellation sound source S to generate the sound wave for cancelling the sound wave propagated from the noise source.

Here, the sound pressure $P_2$ measured at the location of the sensing microphone $M_2$ and the voltages $V_A$, $V_B$, $V_C$ at the measured points are respectively as:

$$P_2=P_1\cdot Gd \quad (1)$$

$$V_A=P_1H_{M1}+V_BHr \quad (2)$$

$$V_B=(V_A-V_C)\,He \quad (3)$$

$$V_C=P_2H_{M2}+V_BHt \quad (4)$$

Also, from the equations (2), (3) $V_B$ can be shown as:

$$V_B=\frac{P_1H_{M1}\cdot He - V_C\cdot He}{1-He\cdot Hr} \quad (5)$$

Similarly, from the equations (4), (5) $V_C$ can be shown as:

$$V_C=\frac{P_2H_{M2}(1-HeHr)+P_1H_{M1}\cdot He\cdot Ht}{1-He(Hr-Ht)} \quad (6)$$

Also, by substituting the equation (1) the equation (6) can be expressed as:

$$V_C=\frac{P_1[H_{M1}\cdot He\cdot Ht+Gd\cdot H_{M2}(1-HeHr)]}{1-He(Hr-Ht)} \quad (7)$$

Here, for $V_C=0$, the following equation must be obtained from the equation (7):

$$He\,(H_{M1}\cdot Ht-Gd\cdot H_{M2}\cdot Hr)=-Gd\cdot H_{M2} \quad (8)$$

As a result of this, the transfer function He can be expressed as follows:

$$He=\frac{-Gd\cdot\frac{H_{M2}}{H_{M1}}}{Ht-Gd\cdot\frac{H_{M2}}{H_{M1}}\cdot Hr} \quad (9)$$

As can be seen from the equation (9), in order to determine the transfer function He, there are necessary the transfer functions $Gd\cdot H_{M2}/H_{M1}$, Ht, Hr. As mentioned before, these transfer functions can be easily identified respectively, using $V_A$, $V_B$, $V_C$ as the measured points thereof.

Figure 4:
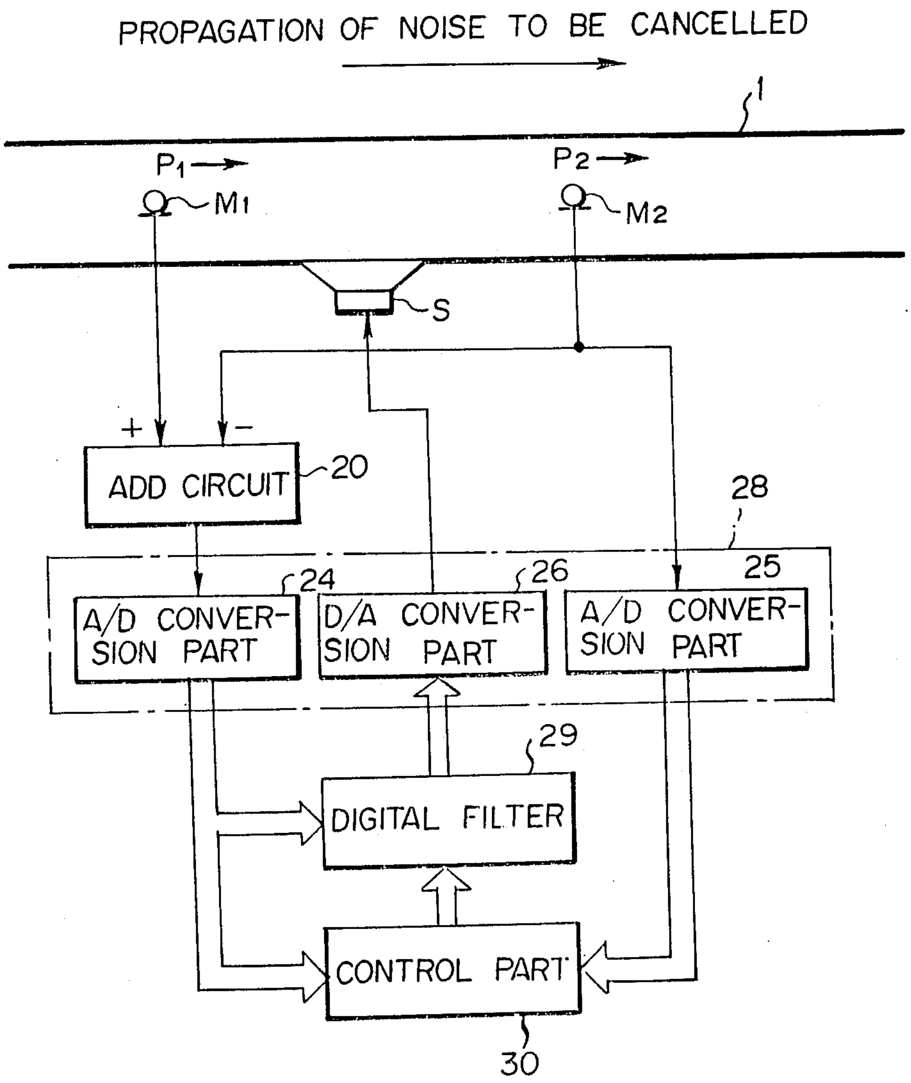
FIG. 4 is a block view to show the concrete structure of the electronic noise attenuation system according to the invention.

Next, in FIG. 4, there is illustrated a concrete structure of an electronic noise attenuation system according to the present invention constructed in accordance with the above-mentioned model.

In FIG. 4, within the propagation passage 1 the two sensing microphones $M_1$, $M_2$ are located at opposite positions with the cancellation sound source S therebetween in which the transfer functions Hr, Ht indicating the propagation characteristics of the sound wave generated from the cancellation sound source are equivalent to each other, for example, at the positions respectively equidistant from the cancellation sound source S.

Also, in FIG. 4, reference character 28 designates an input/output interface which comprises A/D conversion parts 24, 25 and a D/A conversion part 26. Reference numeral 29 stands for a digital filter which generates a drive signal to be output via the D/A conversion part 26 to the speaker S for generating a sound to cancel the sound propagated from the noise source.

Further, there is shown in FIG. 4 a control part which is designated by 30. The control part 30 is adapted to receive the output signal of the add circuit 20 to which the output of the sensing microphone $M_1$, $M_2$ are inputted and the output signal of the sensing microphone $M_2$ which also serves as a microphone for evaluation of the noise cancellation effect, respectively through the A/D conversion parts 24, 25. In accordance with these signals input therein, the control part 30, when there is no noise present within the propagation passage 1, outputs test signals to the respective circuits to derive the transfer functions that indicate the propagation characteristics of the propagation sound wave between the respective electro-acoustical transducers or the conversion characteristics of the respective electro-acoustical transducers themselves; or, when there is present noise in the propagation passage 1, it sets up a control parameter to give a given transfer function to the digital filter 29.

In addition, the control part 30 is capable of adaptive controls so that the above-mentioned control parameter can be corrected according to the changes of the propagation characteristics of the sound wave resulting from possible disturbances within the propagation passage 1, for example, variations of air flow and so on, and the change of the characteristics of the control system.

In the above-mentioned structure, at first in the digital filter 29 there is set up by the control part 30 a control parameter to give a transmission function corresponding to the transmission function He that is determined from the derived results of the transmission functions and is shown in FIG. 2. In this state, if the propagation sound wave generated from the noise source within the propagation passage 1 is sensed by the two microphones $M_1$, $M_2$, then the output signals from the add circuit 20, into which the output signals of the sensing microphones $M_1$ and $M_2$, are input via the A/D conversion part 24 of the input/output interface 28 to the digital filter 29 and the control part 30, respectively.

In the control part 30, in consideration of the changes of the propagation characteristics within the propagation passage 1 as well as the variations of the characteristics of the respective electro-acoustical transducers themselves, the transfer functions that indicate these characteristics are obtained, on the basis of the thus obtained transfer functions, a transfer function to be given to the digital filter 29 is determined so that the output signal of the microphone $M_2$ sensing the noise cancellation effect, that is, the state of interference between the sound wave propagated from the noise source and the sound wave generated from the speaker S can be minimized, and a control parameter to specify the thus determined transfer function is established in the digital filter 29. As discussed above, the control part 30 is able to correct the control parameter as desired according to the variations of the propagation characteristics of the propagation passage 1 as well as the characteristics of the control system. As a result of this, the propagation sound wave from the noise source sensed by the microphones $M_1$ and $M_2$ is converted to an electric signal, the converted electric signal is then input to the digital filter 29 via the add circuit 20 and the A/D conversion part 24 of the input/output interface 28, and the input signal is converted into a digital signal having pretermined amplitude and phase characteristics by the digital filter 29 on the basis of the transfer function given from the control part 30. This digital signal is converted from digital to analog by the D/A conversion part 26 of the input/output interface 28 and is then applied to the drive coil of the speaker S as the drive signal for the speaker S and the speaker S then generates a sound wave to cancel the propagation sound wave generated from the noise source. As a result of this, the propagation sound wave from the noise source can be cancelled at the location of the microphone $M_2$ due to the interference of the two kinds of sound waves and, therefore, the propagation sound wave from the noise source will never be propagated in the portion of the propagation passage downstream of the microphone $M_2$. Also, although the cancelling sound wave generated from the speaker S is also sensed by the microphones $M_1$ and $M_2$ and an acoustical feedback system is produced between the speaker S and the microphones $M_1$, $M_2$, as described before, due to the fact that the two microphones $M_1$ and $M_2$ are located at the positions in which the transfer functions thereof are equivalent to each other from the cancellation sound source S as well as to the fact that the output signal of the microphone $M_2$ is added to the outupt signal of the microphone $M_1$ with the former output signal being made 180° out of phase with the latter, the electric signal corresponding to the sound wave propagated from the speaker S to the sensing microphone $M_1$ can be cancelled in the add circuit 20, so that an acoustic feedback from the speaker S as the cancellation sound toward the sensing microphone $M_1$ is prevented, that is, no oscillation of the control system is produced.

Figure 5:
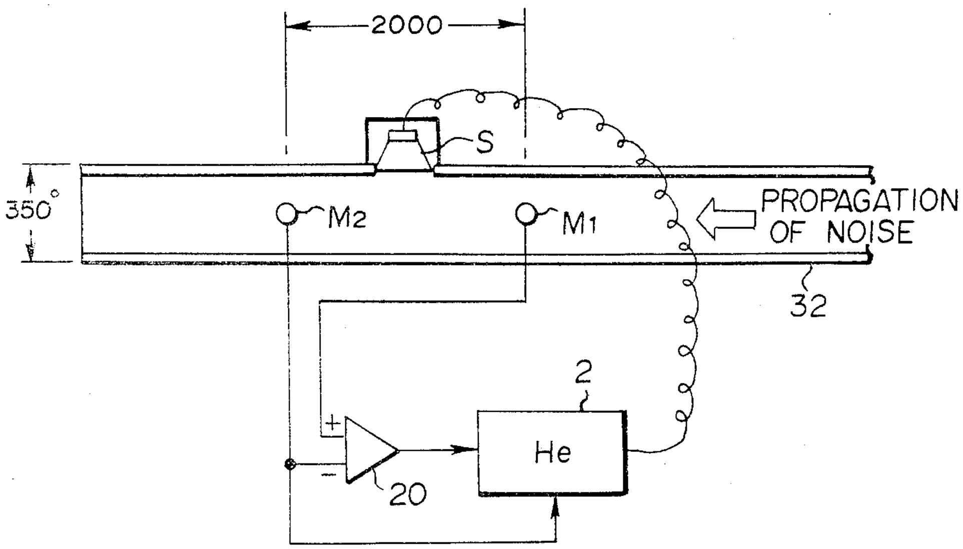
FIG. 5 is an explanatory view to illustrate the electronic noise attenuation system of the invention when it is applied to an air conditioning system.

In FIG. 5 there is illustrated the structure of the electronic noise attenuation system according to the invention when it is actually applied to an air conditioning duct equipment. As shown in FIG. 5 the air duct has an aperture of 350 mm square and the present electronic noise attenuation system is installed intermediate a straight pipe duct system. The distance of the straight section of the duct in which the present electronic noise attenuation system is installed is 2000 mm. Also, as the noise source, a turbo-fan is employed, that is, a fan noise produced by the turbo-fan is used as the noise.

Figure 6:
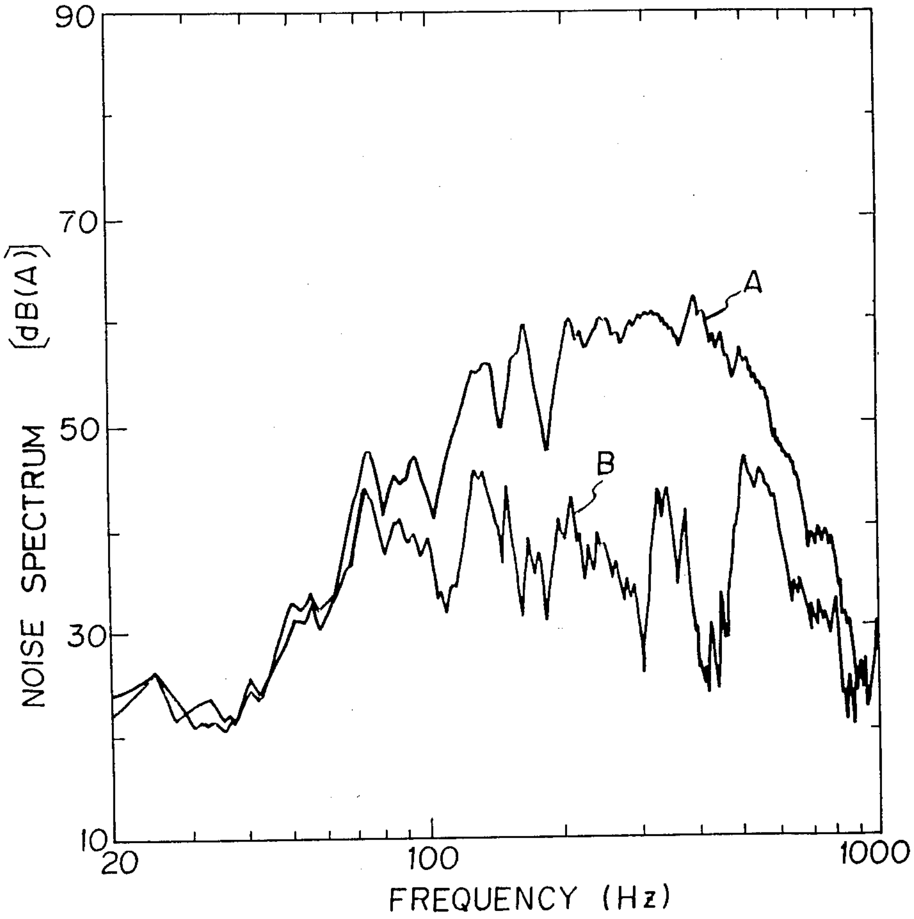
FIG. 6 is a characteristic view to illustrate the noise attenuation effects of the applied electronic noise attenuation system shown in FIG. 5.

The results obtained in the above-mentioned experiment are shown in FIG. 6. In FIG. 6, curved lines A, B stand for the frequency characteristics of the noise at the positions where the microphone $M_2$ is located within an air conditioning duct 32. Specifically, the curved line A represents the frequency characteristic of the noise obtained when the electronic noise attenuation system is not operated; and the curved line B represents the noise frequency characteristic obtained when the electronic noise attenuation system is operated. As can be seen from FIG. 6, in the wide range of frequencies from 60 $H_z$ to 900 $H_z$ there can be recognized a high noise cancellation effect of up to about 35 dB.

As discussed above, according to the illustrated embodiment of the invention, the noise can be cancelled in a stable and highly efficent manner by a simple structure.

Referring again to FIG. 4, although the microphone for evaluation of the amount of the sound to be cancelled serves also as the sensing microphone $M_2$, alternatively a new sensing microphone $M_2$ may be provided.

Also, the cancellation sound amount evaluation microphone may be provided externally of the propagation passage.

Further, although in FIG. 4 no sound absorption material such as glass wool or the like is attached to the inside wall surface of the propagation passage 1 between the speaker S and the microphone $M_1$, if such sound absorption material is attached to the inside wall surface of the propagation passage so as to be able to serve also as a noise cancelling device of a sound absorption type, then the noise cancelling effect can be enhanced further.

In addition, in FIG. 4, the two microphones $M_1$, $M_2$ are located substantially in the central portion of the propagation passage 1, but these microphones may be provided on the wall surface of the propagation passage 1.

As has been described heretofore, the present invention is constructed such that it includes in a propagation passage of a sound first and second mechano-electric transducer means respectively located in the direction of propagation of the sound at the positions in which transfer functions indicating the propagation characteristics of the sound are equivalent to each other on the basis of an electro-mechanical transducer means as a source of a cancellation sound with the electro-mechanical transducer means therebetween; and, an operation means for adding the output signal of the first mechano-electric transducer means and the output signal of the second mechano-electric transducer means with the latter signal being made 180° out of phase with the former signal. Therefore, according to the invention, a simple structure can be used to prevent easily the occurrence of an acoustic feedback from the electro-mechanical transducer means as the cancellation sound source to the mechano-electric transducer means for detecting the sound wave propagated from a source of noise and thus it is possible to realize an electronic noise attenuation system which is capable of stable and highly accurate cancellation of non-steady noise occurring in a wide range of a propagation passage such as a pipe line or the like by applying an adaptive control.

It should be understood, however, that there is no intention to limit the invention to the specific forms disclosed, but on the contrary, the invention is to cover all modifications, alternative constructions and equivalents falling within the spirit and scope of the invention as expressed in the appended claims.

What is claimed is:

1. An electronic noise attentuation system for achieving attenuation of a sound wave propagated from a source of noise in a propagation passage of a sound wave by generating another sound wave 180° out of phase and having the same sound pressure as said propagated sound wave to produce interference between said two sound waves at a given position in said propagation passage, said system comprising:

first mechano-electric transducer means comprising a first microphone having a conversion characteristic and disposed at a position closer to said noise source than to said given position in said propagation passage to sense said propagated sound wave from said noise source and convert it into an output electric signal;

electro-mechanical transducer means comprising a speaker having a conversion characteristic and interposed between the position of said first mechano-electric transducer means and said given position in said propagation passage to generate a sound wave for cancelling said propagated sound wave from said noise source at said given position;

second mechano-electric transducer means comprising a second microphone having a conversion characteristic which matches said conversion characteristic of said first microphone and interposed between the position of said electro-mechanical transducer means and said given position to sense said generated sound wave from said electro-mechanical transducer means as well as said propagated sound wave from said noise source and convert them into an output electric signal;

operation means to obtain a difference between the output signals of said first and second mechano-electric transducer means and to generate an output signal representative of said difference;

drive signal generating means to receive the output signal of said operation means and generate on the basis of a given transfer function a drive signal to be given to said electro-mechanical transducer means so that the amount of sound cancellation of said electronic noise attenuation system can be maximized;

control means to determine a transfer function to be given to said drive signal generating means, set up in said drive signal generating means a control parameter for specifying said transfer function, and correct said control parameter according to changes of the propagation characteristics of said propagation passage as well as to changes of characteristics of the transducer means of said electronic noise attenuation system;

wherein said first and second mechano-electric transducer means are located in said sound wave propagation passage with said electro-mechanical transducer means therebetween at positions in which a transfer function Hr indicating a propagation characteristic of the sound wave propagated from said electro-mechanical transducer means toward said first mechano-electric transducer means with the conversion characteristics of said electro-mechanical transducer means and said first mechano-electric transducer means added thereto is equivalent to a transfer function Ht indicating a propagation characteristic of the sound wave propagated from said electro-mechanical transducer means with the conversion characteristics of said electro-mechanical transducer means and said second mechano-electric transducer means added thereto.

2. An electronic noise attenuation system as set forth in claim 1, wherein said transfer functions Hr and Ht can be shown as follows:

$$Hr = HM1' \cdot Gd' \cdot Hs'$$

$$Ht = Hs \cdot Gt \cdot HM2'$$

where HM1′ represents a transfer function indicating a sound pressure-voltage conversion characteristic of said first mechano-electric transducer means with respect to a sound wave propagated from said electro-mechanical transducer means to said first mechano-electric transducer means in said sound wave propagation passage, HM2′ represents a transfer function indicating a sound pressure-voltage conversion characteristic of said second mechano-electric transducer means with respect to a sound wave propagated from said electro-mechanical transducer means to said second mechano-electric transducer means in said sound wave propagation passage, Hs represents a transfer function indicating a voltage-sound pressure conversion characteristic of said electro-mechanical transducer means toward said second mechano-electric transducer means, Hs′ represents a transfer function indicating a voltage-sound pressure conversion characteristic of said electro-mechanical transducer means toward said first mechano-electric transducer means, Gd′ represents a transfer function indicating a propagation characteristic of the sound wave propagated in said propagation passage from said electro-mechanical transducer means to said first mechano-electric transducer means, and Gt represents a transfer function indicating a propagation characteristic of the sound wave propagated in said propagation passage from said electro-mechanical transducer means to said second mechano-electric transducer means.

3. An electronic noise attenuation system as set forth in claim 2, wherein a transfer function He to be given to said drive signal generating means by said control means can be shown as follows:

$$He = \frac{-Gd \cdot \frac{H_{M2}}{H_{M1}}}{Ht - Gd \cdot \frac{H_{M2}}{H_{M1}} \cdot Hr}$$

where Gd represents a transfer function indicating a propagation characteristic of a sound wave propagated from said first mechano-electric transducer means to said second mechano-electric transducer means in said propagation passage, $H_{M1}$ represents a transfer function indicating a sound pressure-voltage conversion characteristic of said first mechano-electric transducer means with respect to a sound wave sensed by said first mechano-electric transducer means in said propagation passage, and $H_{M2}$ represents a transfer function indicating a sound pressure—voltage conversion characteristic of said second mechano-electric transducer means with respect to a sound wave sensed by said second mechano-electric tranducer means in said propagation passage.

4. An electronic noise attenuation system as set forth in claim 2, wherein said first and second mechano-electric transducer means are located with said electro-mechanical transducer means therebetween at positions respectively equidistant from said electro-mechanical transducer means in said propagation passage.

5. An electronic noise attenuation system as set forth in claim 4, wherein a sound absorption material is attached to the inside wall surface of said sound wave propagation passage extending from said electro-mechanical transducer means to said first mechano-electric transducer means.

6. An electronic noise attenuation system as set forth in claim 5, wherein said operation means is an add circuit adapted to add the output signal of said first mechano-electric transducer and a phase inverted version of the output signal of said second mechano-electric transducer means.

7. An electronic noise attenuation system as set forth in claim 6, wherein said drive signal generating means includes a digital filter adapted to generate said drive signal to be given to said electro-mechanical transducer means and an input/output interface.

8. An electronic noise attenuation system as set forth in claim 7, wherein said input/output interface comprises a first A/D conversion part to convert the output signal of said operation means from analog to digital, a second A/D conversion part to convert the output signal of said second mechano-electric transducer means from analog to digital, and a D/A conversion part to convert the output signal of said digital filter from digital to analog.

9. An electronic noise attenuation system for attenuating a sound wave propagated from a source of noise in a sound wave propagation passage comprising:

first sensing means for sensing said sound wave propagated from said noise source and for converting said sound wave propagated from said noise source to an output electric signal;

sound generation means for generating a sound wave for cancelling said sound wave propagated from said noise source;

second sensing means for sensing said sound wave propagated from said noise source and from said sound generation means and for converting said sound waves to an output electric signal;

operation means for calculating a difference between the output signals of said first and second sensing means;

drive signal generating means responsive to said difference for generating, on the basis of a controllable transfer function, a drive signal for said sound generation means whereby an amount of sound cancellation of said electronic noise attenuation system is maximized;

control means for determining said controllable transfer function and for correcting said controllable transfer function according to changes of propagation characteristics of said propagation passage and according to changes of conversion transfer functions of said first and second sensing means and said sound generation means;

wherein said first and second sensing means are located in said sound wave propagation passage with said sound generation means therebetween at positions in which a propagation transfer function of a sound wave propagated from said sound generation means toward said first sensing means with said conversion transfer functions of said sound generation means and said first sensing means added thereto is made equal to a propagation transfer function of a sound wave propagated from said sound generation means toward said second sensing means with the conversion transfer functions of said sound generation means and said second sensing means added thereto.

10. An electronic noise attentuation system as set forth in claim 9 wherein said conversion transfer functions of said first and second sensing means indicate sound pressure-voltage conversion characteristics, said conversion transfer function of said sound generation means indicates a voltage-sound pressure conversion characteristic, and said propagation transfer functions indicate propagation characteristics of the sound wave propagated in said propagation passage.

11. An electronic noise attenuation system as set forth in claim 9 wherein the propagation transfer function of said sound wave propagated from said sound generation means toward said first sensing means with said conversion transfer function of said sound generation means and said first sensing means added thereto is equal to a transfer function Hr and said propagation transfer function of said sound wave propagated from said sound generation means toward said second sensing means with the conversion transfer functions of said sound generation means and said second sensing means added thereto is equal to a transfer function Ht, wherein:

$$Hr = HM1' \cdot Gd' \cdot Hs'$$

$$Ht = Hs \cdot Gt \cdot HM2'$$

where HM1' is a transfer function indicating a sound pressure-voltage conversion charactertistic of said first sensing means with respect to a sound wave propagated from said sound generation means to said first sensing means in said sound wave propagation passage, HM2' is a transfer function indicating a sound pressure-voltage conversion characteristic of said second sensing means with respect to a sound wave propagated from said sound generation means to said second sensing means, Hs is a transfer function indicating a voltage-sound pressure conversion characteristic of said sound generation means toward said second sensing means, Hs' is a transfer function indicating a voltage-sound pressure conversion characteristic of said sound generation means toward said first sensing means, Gd' is a transfer function indicating a propagation characteristic of the sound wave propagated in said propagation passage from said sound generation means to said first sensing means, and Gt is a transfer function indicating a propagation characteristic of the sound wave propagated in said propagation passage from said sound generation means to said second sensing means.

12. An electronic noise attentuation system as set forth in claim 11, wherein said controllable transfer function is represented by He and is calculated as follows:

$$He = \frac{-Gd \cdot \frac{H_{M2}}{H_{M1}}}{Ht - Gd \cdot \frac{H_{M2}}{H_{M1}} \cdot Hr}$$

where Gd is a transfer function indicating a propagation characteristic of a sound wave propagated from said first sensing means to said second sensing means in said propagation passage, $H_{M1}$ is a transfer function indicating a sound pressure-voltage conversion characteristic of said first sensing means with respect to a sound wave sensed by said first sensing means in said propagation passage, and $H_{M2}$ represents a transfer function indicating a sound pressure—voltage conversion characteristic of said second sensing means with respect to a sound wave sensed by said second sensing means in said propagation passage.

13. An electronic noise attenuation system as set forth in claim 11, wherein said first and second sensing means are located with said sound generation means therebetween at positions respectively equidistant from said sound generation means in said propagation passage.

14. An electronic noise attenuation system as set forth in claim 13, wherein a sound absorption material is attached to an inside wall surface of said sound wave propagation passage extending from said sound generation means to said first sensing means.

* * * * *